(12) United States Patent
Kuo et al.

(10) Patent No.: US 10,347,678 B2
(45) Date of Patent: Jul. 9, 2019

(54) IMAGE SENSOR WITH SHIFTED MICROLENS ARRAY

(71) Applicant: VisEra Technologies Company Limited, Hsin-Chu (TW)

(72) Inventors: Wu-Cheng Kuo, Hsin-Chu (TW); Kuo-Feng Lin, Kaohsiung (TW); Tsung-Lin Wu, Taichung (TW); Chin-Chuan Hsieh, Hsin-Chu (TW)

(73) Assignee: Visera Technologies Company Limited, Hsin-Chu (TW)

( * ) Notice: Subject to any disclaimer, the term of this patent is extended or adjusted under 35 U.S.C. 154(b) by 0 days.

(21) Appl. No.: 15/815,092

(22) Filed: Nov. 16, 2017

(65) Prior Publication Data

US 2019/0148433 A1  May 16, 2019

(51) Int. Cl.
*H01L 27/146* (2006.01)
*G02B 3/00* (2006.01)
*F21V 5/00* (2018.01)
*G02B 27/09* (2006.01)

(52) U.S. Cl.
CPC ........ *H01L 27/14627* (2013.01); *F21V 5/004* (2013.01); *G02B 3/0006* (2013.01); *G02B 3/0043* (2013.01); *G02B 27/0961* (2013.01)

(58) Field of Classification Search
CPC ............ H01L 27/14627; G02B 3/0043; G02B 3/0037; G02B 3/0056; G02B 27/0961; G02B 3/0006
USPC .................................................. 359/619, 626
See application file for complete search history.

(56) References Cited

U.S. PATENT DOCUMENTS

| 8,274,123 B2 * | 9/2012 | Tanaka ................. G02B 3/0056 257/432 |
| 2007/0002159 A1 | 1/2007 | Olsen et al. |
| 2010/0025791 A1 * | 2/2010 | Ogawa ............. H01L 27/14618 257/432 |

(Continued)

FOREIGN PATENT DOCUMENTS

| TW | 201028726 A | 8/2010 |
| TW | 201606354 A | 2/2016 |

OTHER PUBLICATIONS

Taiwanese Office Action of corresponding TW application No. 107122945 dated Apr. 16, 2019, 14 pages.

*Primary Examiner* — Ryan D Howard
(74) *Attorney, Agent, or Firm* — Muncy, Geissler, Olds & Lowe, P.C.

(57) ABSTRACT

An image sensor is provided. The image sensor includes a microlens array having a plurality of microlenses; and a sensor array having a plurality of photoelectric elements that are arranged into a plurality of macro pixels. Each macro pixel includes a first photoelectric element, a second photoelectric element, a third photoelectric element, and a fourth photoelectric element that receive incident light via a first microlens, a second microlens, a third microlens, and a fourth lens in the plurality of microlenses. The first microlens, the second microlens, the third microlens, and the fourth microlens in each macro pixel have a first initial offset, a second initial offset, a third initial offset, and a fourth initial offset, respectively. The first microlens and the second microlens in each of the plurality of macro pixels further have a first additional offset and a second additional offset, respectively.

16 Claims, 17 Drawing Sheets

(56) References Cited

U.S. PATENT DOCUMENTS

| | | | |
|---|---|---|---|
| 2011/0096210 A1* | 4/2011 | Koshino | H01L 27/14627 |
| | | | 348/273 |
| 2015/0009304 A1* | 1/2015 | Linge | H04N 13/31 |
| | | | 348/51 |
| 2015/0009367 A1* | 1/2015 | Kobayashi | G02B 7/34 |
| | | | 348/240.3 |
| 2015/0201121 A1* | 7/2015 | Nobayashi | G02B 7/34 |
| | | | 348/222.1 |

* cited by examiner

IMAGE SENSOR WITH SHIFTED MICROLENS ARRAY

BACKGROUND OF THE INVENTION

Field of the Invention

The present invention relates to an image sensor and, in particular, to an image sensor with a shifted microlens array.

Description of the Related Art

A light-field camera is a camera that uses a microlens array to capture 3D light-field information of a scene. Therefore, a user may refocus the image generated by the light-field camera. However, a conventional light-field camera has disadvantages such as low image resolution, a bulky camera module, or low light transmission. Thus, there is demand for an image sensor equipped in a light-field device to solve the aforementioned problems.

BRIEF SUMMARY OF THE INVENTION

A detailed description is given in the following embodiments with reference to the accompanying drawings.

An image sensor is provided. The image sensor includes a microlens array comprising a plurality of microlenses; and a sensor array comprising a plurality of photoelectric elements that are arranged into a plurality of macro pixels. Each of the plurality of macro pixels comprises a first photoelectric element, a second photoelectric element, a third photoelectric element, and a fourth photoelectric element that receive incident light via a first microlens, a second microlens, a third microlens, and a fourth lens in the plurality of microlenses. The first microlens, the second microlens, the third microlens, and the fourth microlens in each of the plurality of macro pixels have a first initial offset, a second initial offset, a third initial offset, and a fourth initial offset, respectively. The first microlens and the second microlens in each of the plurality of macro pixels further have a first additional offset and a second additional offset, respectively.

In one aspect of the invention, the first photoelectric element, the second photoelectric element, the third photoelectric element, and the fourth photoelectric element in each of the plurality of macro pixels are arranged in a first 2×2 array, and the first microlens, the second microlens, the third microlens, and the fourth microlens in each of the plurality of macro pixels are respectively shifted by the first initial offset, the second initial offset, the third initial offset, and the fourth initial offset toward a center of the sensor array.

In another aspect of the invention, each of the plurality of macro pixels in the sensor array outputs an intensity signal that is used to determine distance and direction information of an object from the incident light, and a look-up table recording a plurality of intensity distributions of the intensity signal from each of the plurality of macro pixels in the sensor array is used to determine the distance and direction information of the object.

In one aspect of the invention, the plurality of microlenses is arranged in a two-dimensional manner, and there is a gap between every two neighboring microlenses in the plurality of microlenses, and the gap may be filled with a low-refractive-index material or air. In addition, the shape of the plurality of microlenses may be a flat type or a curve type.

In an embodiment of the invention, the first microlens is further shifted by the first additional offset in a first direction, and the second microlens is further shifted by the second additional offset in a second direction opposite to the first direction, and the first addition offset is equal to the second additional offset. In addition, the third microlens further has a third additional offset, and the fourth microlens further has a fourth additional offset, and the third microlens is further shifted by the third additional offset in a third direction, and the fourth microlens is further shifted by the fourth additional offset in a fourth direction opposite to the third direction, wherein the third additional offset is equal to the fourth additional offset, and the first direction is perpendicular to the third direction.

In an alternative embodiment of the invention, the first microlens is further shifted by the first additional offset in a first direction, and the second microlens is further shifted by the second additional offset in the first direction, and the first addition offset is greater than the second additional offset. In addition, the third microlens further has a third additional offset, and the fourth microlens further has a fourth additional offset, and the third microlens is further shifted by the third additional offset in a second direction, and the fourth microlens is further shifted by the fourth additional offset in the second direction, wherein the third additional offset is greater than the fourth additional offset, and the first direction is perpendicular to the second direction.

In one aspect of the invention, the image sensor further includes a color filter array disposed between the microlens array and the sensor array, and the image sensor includes a plurality of green filters for extracting green light from the incident light, a plurality of red filters for extracting red light from the incident light, and a plurality of blue filters, for extracting blue light from the incident light.

In one aspect of the invention, the plurality of macro pixels is arranged into a plurality of macro cells, and each of the plurality of macro cells comprises a first macro pixel, a second macro pixel, a third macro pixel, and a fourth macro pixel that are arranged in a second 2×2 array, and the first macro pixel, the second macro pixel, the third macro pixel, and the fourth macro pixel in each of the plurality of macro cells receives the green light, the red light, the blue light, and the green light, respectively.

In one aspect of the invention, the first additional offset of the first microlens and the second additional offset of the second microlens in the second macro pixel and the third macro pixel in each of the plurality macro cells are zero, and the first additional offset of the first microlens and the second additional offset of the second microlens in the first macro pixel and the fourth macro pixel in each of the plurality of macro cells are not zero.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
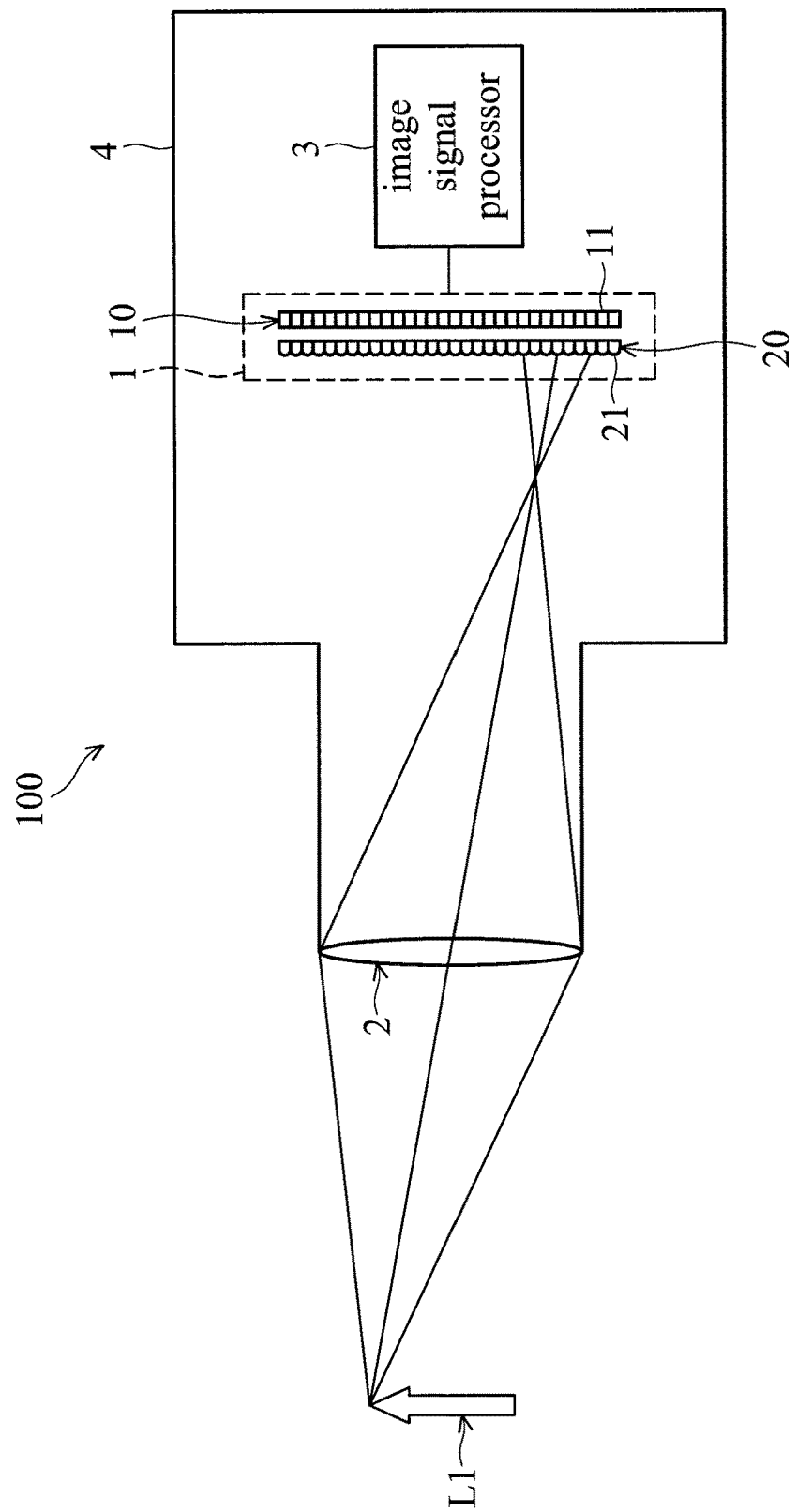
FIG. 1 is a schematic view of a light-field device 100 in accordance with an embodiment of the invention.

FIG. 1 is a schematic view of a light-field device 100 in accordance with an embodiment of the invention. The light-field device 100 may be a light-field camera, or a light-field camera module disposed in an electronic device such as a mobile phone or a portable computer.

The light-field device 100 includes an image sensor 1, a lens 2, an image signal processor (ISP) 3, and a housing 4. The image sensor 1 and the ISP 3 are disposed in the housing 4, and the lens 2 is disposed on the housing 4. A light beam L1 passes through the lens 2 into the housing 4, and is emitted to the image sensor 1. The image sensor 1 outputs an image signal by detecting the incident light. The ISP 3 receives an image signal from the image sensor 1 and generates a three-dimensional image using the image signal from the image sensor 1.

In an embodiment, the image sensor 1 includes a sensor array 10 and a microlens array 20. The sensor array 10 includes a plurality of photoelectric elements 11 arranged in a two-dimensional matrix. The microlens array 20 is disposed between the lens 2 and the sensor array 10, and includes a plurality of microlenses 21 arranged in a two-dimensional manner.

In the embodiment, the microlenses 21 of the microlens array 20 and the photoelectric elements 11 of the sensor array 10 may be arranged in a one-to-one correspondence. That is, the two-dimensional matrix of the microlenses 21 may be disposed to correspond to the two-dimensional matrix of the photoelectric elements 11. For example, each of the microlenses 21 may be disposed to correspond to each of the photoelectric elements 11, and direct the incident light onto each of the photoelectric elements 11.

Figure 2A:
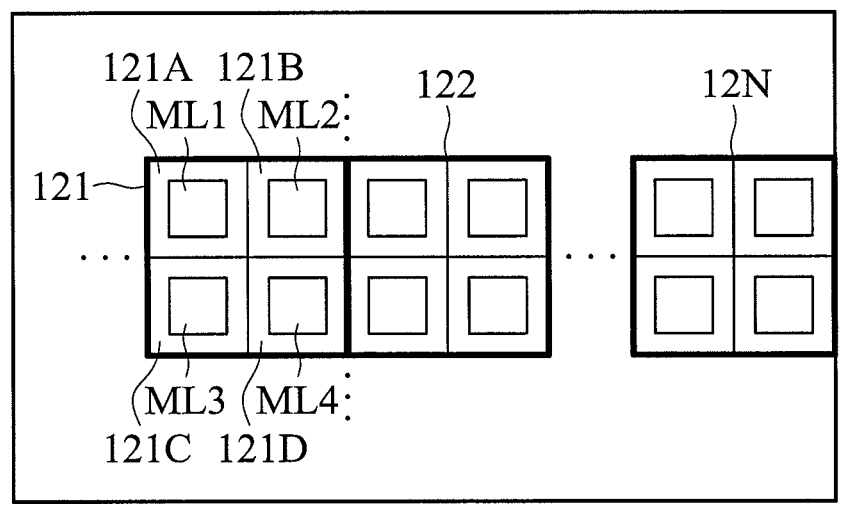
FIG. 2A is a diagram illustrating macro pixels in the sensor array in accordance with an embodiment of the invention.

FIG. 2A is a diagram illustrating macro pixels in the sensor array in accordance with an embodiment of the invention. In an embodiment, the photoelectric elements 11 in the sensor array 10 are arranged into a plurality of macro pixels 121~12N, where each of the macro pixels 121~12N includes four photoelectric elements. For example, the four photoelectric elements in each of the macro pixels may be arranged in a 2×2 array. In some embodiments, the four electric elements in each of the macro pixels may also be arrange in a 4×4 array, a 6×6 array, or an 8×8 array, but the invention is not limited thereto. It should be noted that a microlens is arranged to correspond to each of the four photoelectric elements in each of the macro pixels 121~12N. Using the macro pixel 121 as an example, microlenses ML1~ML4 are arranged to correspond to the photoelectric elements 121A, 121B, 121C, and 121D in the macro pixel 121, respectively.

Figure 2B:
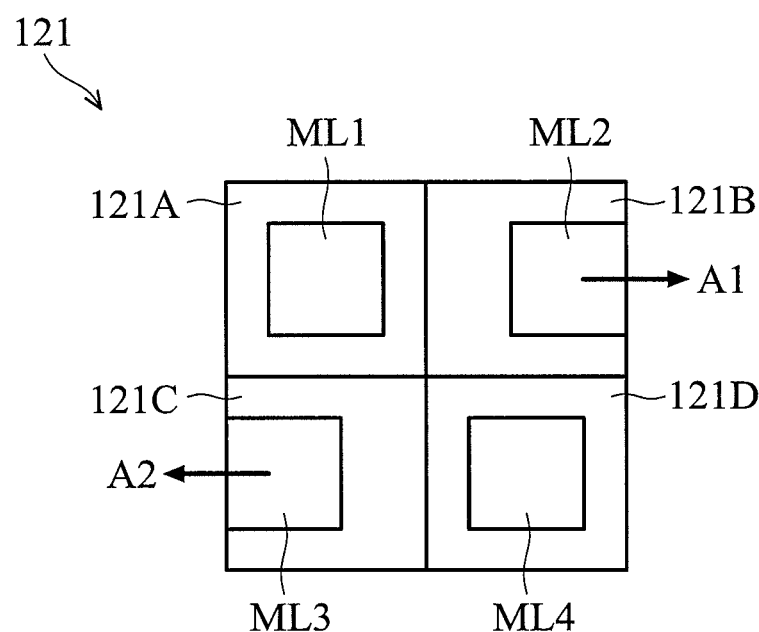
FIG. 2B is a diagram of a macro pixel with shifted microlenses in accordance with an embodiment of the invention.
Figure 2C:
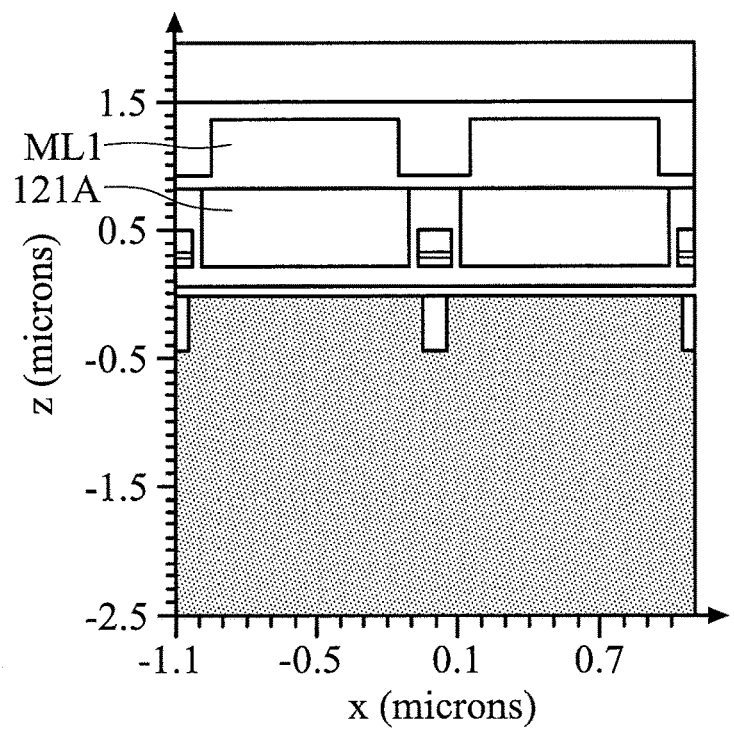
FIG. 2C is a cross-sectional view of a photoelectric element and its microlens with no offset value in accordance with the embodiment of FIG. 2B.
Figure 2D:
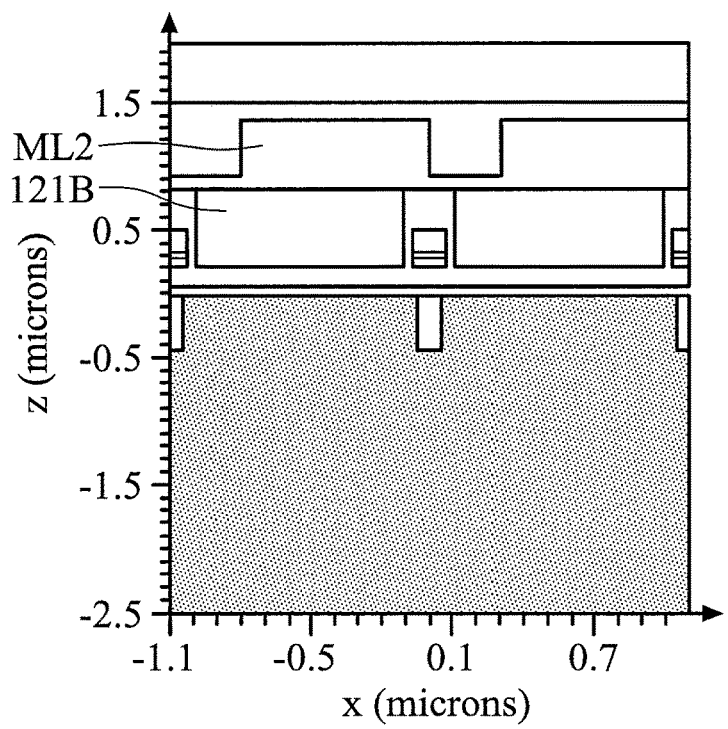
FIG. 2D is a cross-sectional view of a photoelectric element and its microlens with an offset value in accordance with the embodiment of FIG. 2B.

FIG. 2B is a diagram of a macro pixel with shifted microlenses in accordance with an embodiment of the invention. FIG. 2C is a cross-sectional view of a photoelectric element and its microlens with no offset value in accordance with the embodiment of FIG. 2B. FIG. 2D is a cross-sectional view of a photoelectric element and its microlens with an offset value in accordance with the embodiment of FIG. 2B.

In some embodiments, referring to FIG. 2B, the microlenses ML1~ML4 may not be disposed directly on the photoelectric elements 121A~121D, and each of the microlenses ML1~ML4 has a respective initial offset and direction. In addition, one or more of the microlenses ML1~ML4 may also have a respective additional offset.

For purposes of description, it is assumed that the macro pixel 121 is located at the center of the sensor array 10, and the initial offsets of the microlenses ML1~ML4 are 0. The microlens ML2 associated with the photoelectric element 121B has an additional offset A1 in the positive first direction (e.g. positive direction of X-axis), and the microlens ML3 associated with the photoelectric element 121C has an additional offset A2 in the second direction (e.g. negative direction of X-axis) opposite to the first direction. In an embodiment, the offsets A1 and A2 are equal. That is, the microlens ML2 is shifted by the offset A1 toward the first direction (e.g. positive direction of X-axis), and the microlens ML3 is shifted by the offset A2 toward the second direction (e.g. negative direction of X-axis) opposite to the first direction.

The cross-sectional view of the photoelectric element 121A and its corresponding microlens ML1 is shown in FIG. 2C. Accordingly, the microlens ML1 can be disposed directly on the photoelectric element 121A with no offset when the macro pixel 121 is located in the center of the sensor array 10. That is, the center of the microlens ML1 is aligned with the center of the photoelectric element 121A, as illustrated in FIG. 2C.

The cross-sectional view of the photoelectric element 121B and its corresponding microlens ML2 is shown in FIG. 2D. Accordingly, the microlens ML2 can be disposed on the photoelectric element 121B with an additional offset A1 when the macro pixel 121 is located in the center of the sensor array 10. That is, the center of the microlens ML2 is shifted by the offset A1 toward the positive direction of the X-axis, as illustrated in FIG. 2D.

Figure 2E:
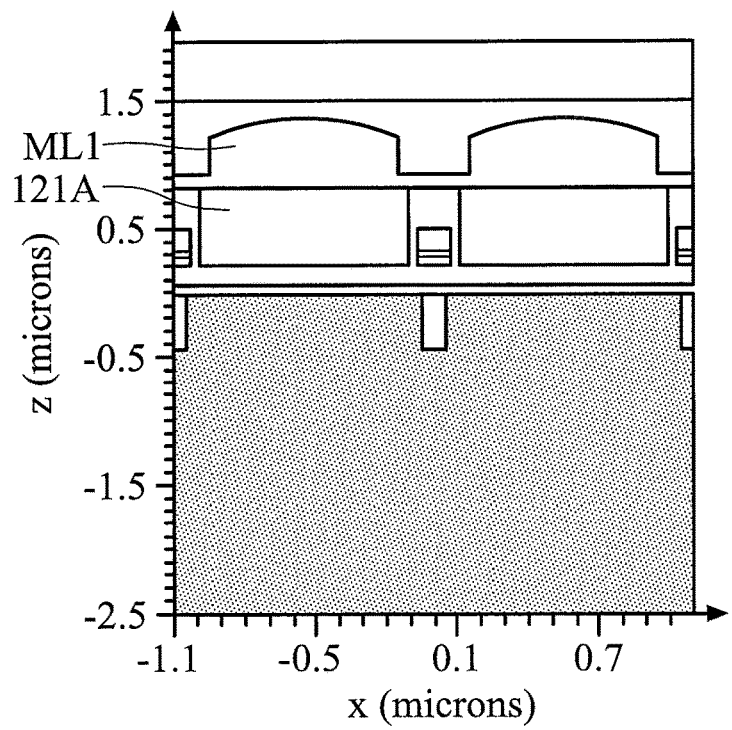
FIG. 2E is a cross-sectional view of a photoelectric element and its microlens with no offset value in accordance with the embodiment of FIG. 2B.
Figure 2F:
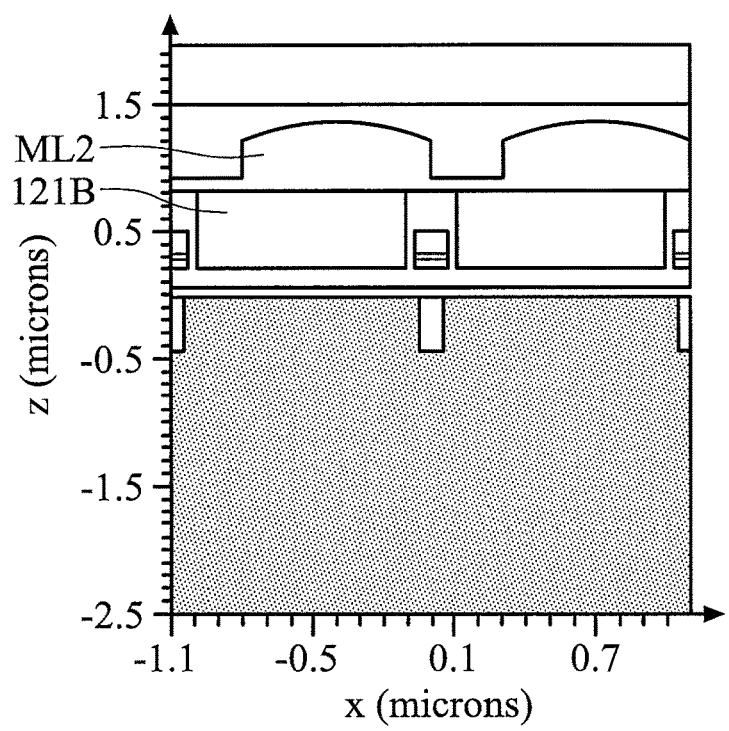
FIG. 2F is a cross-sectional view of a photoelectric element and its microlens with an offset value in accordance with the embodiment of FIG. 2B.

FIG. 2E is a cross-sectional view of a photoelectric element and its microlens with no offset value in accordance with the embodiment of FIG. 2B. FIG. 2F is a cross-sectional view of a photoelectric element and its microlens with an offset value in accordance with the embodiment of FIG. 2B.

It should be noted that the shape of the microlenses ML1~ML4 is a flat type in the embodiment of FIG. 2C and FIG. 2D. Alternatively, the shape of the microlenses ML1~ML4 may be a curve type. For example, the alternative cross-sectional view of the photoelectric element 121B and its corresponding microlens ML2 is shown in FIG. 2E, and the shape of the microlens ML2 is a curve type. The alternative cross-sectional view of the photoelectric element 121B and its corresponding microlens ML2 is shown in FIG. 2F, and the shape of the microlens ML3 is a curve type.

In an embodiment, the microlenses 21 in the microlens array 20 are arranged in a two-dimensional manner, and there is a gap between every two neighboring microlenses in the microlens array. It should be noted that the gap does not only exist between every two neighboring microlenses within a single macro pixel, but also exists between two neighboring microlenses of every two neighboring macro pixels in the microlens array 20. In some embodiments, the gap between every two neighboring microlenses may be filled with a low-refractive-index (low-n) material. In some alternative embodiments, the gap between every two neighboring microlenses may be air.

Figure 2G:
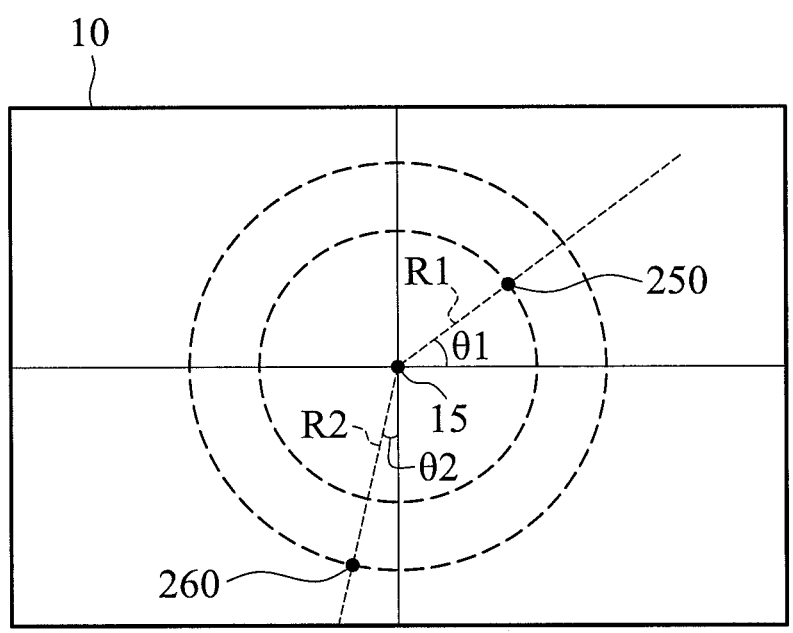
FIG. 2G is a diagram of the sensor array in accordance with an embodiment of the invention.

FIG. 2G is a diagram of the sensor array in accordance with an embodiment of the invention. In an embodiment, the sensor array 10 has a center 15 that receives light with a chief ray angle of 0 degrees. However, the pixels at the corners of the sensor array 10 may receive light with larger chief ray angles.

Specifically, each of the macro pixels of the sensor array 10 has a radial distance relative to the center 15 of the sensor array 10. Specifically, when the radial distance of a specific macro pixel is larger, the chief ray angle of the specific macro pixel is also larger. Thus, the microlenses corresponding to the photoelectric elements in the specific macro pixel should be shifted toward the center 15 of the sensor array 10 with a greater offset so as to minimize signal degradation.

For example, the macro pixel at position 250 has a radial distance R1 to the center 15 of the sensor array 10, and the X-axis and the dotted line connecting position 250 and the center 15 has an inner angle $\theta_1$. Thus, the initial offsets of the microlenses in the macro pixel at position 250 can be determined according to the radial distance R1 and the inner angle $\theta_1$.

In addition, the macro pixel at position 260 has a radial distance R2 to the center 15 of the sensor array 10, and the Y-axis and the dotted line connecting position 260 and the center 15 has an inner angle $\theta_2$. Thus, the initial offsets of the microlenses in the macro pixel at position 260 can be determined according to the radial distance R1 and the inner angle $\theta_2$. Techniques for calculating the initial offsets of the microlenses in a given macro pixel in the sensor array are well-known to a person skilled in the art, and thus the details will be omitted here.

Specifically, the initial offset may be a two-dimensional offset along the X-axis and the Y-axis, depending on the location of the given macro pixel, and the direction of the initial offset is toward the center 15 of the sensor array 10.

It should be noted that the microlenses in the given macro pixel in the sensor array may have a respective additional offset in addition to the initial offset, and the details will be described later.

Figure 3A:
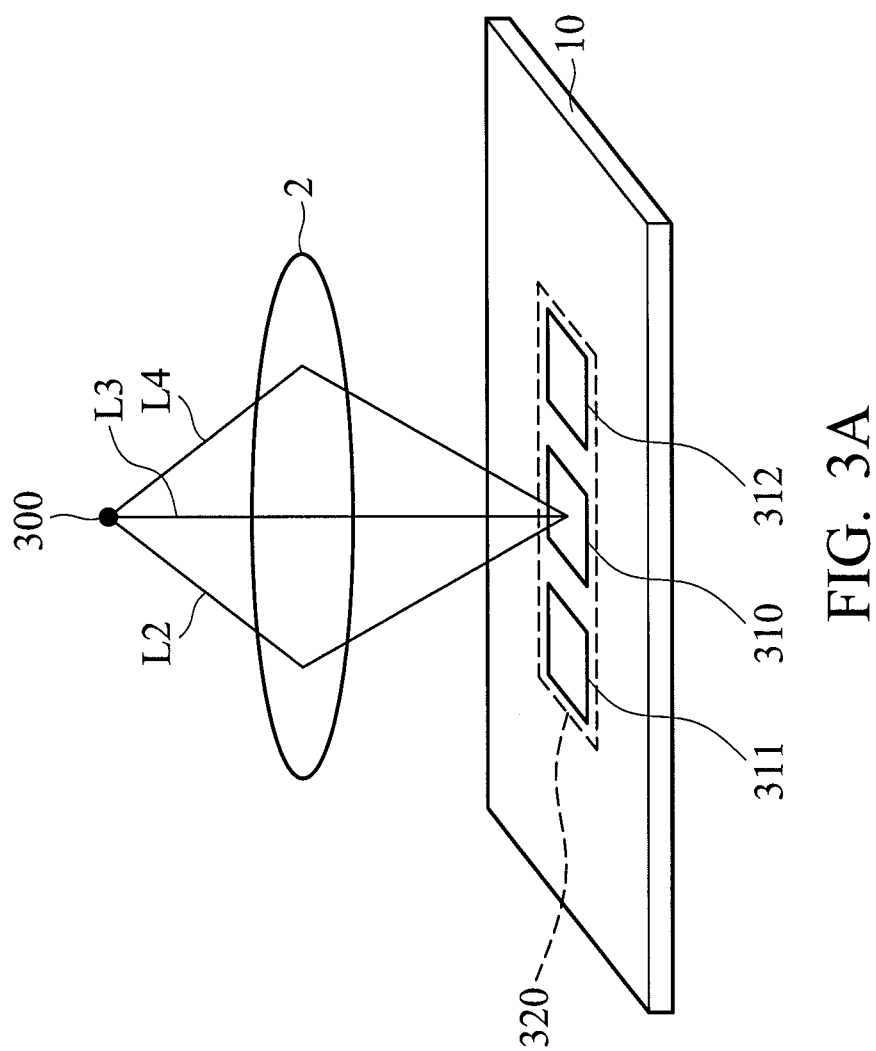
FIG. 3A is a cross-sectional view illustrating the structure and operation of the light-field device in accordance with the embodiment of FIG. 1.
Figure 3B:
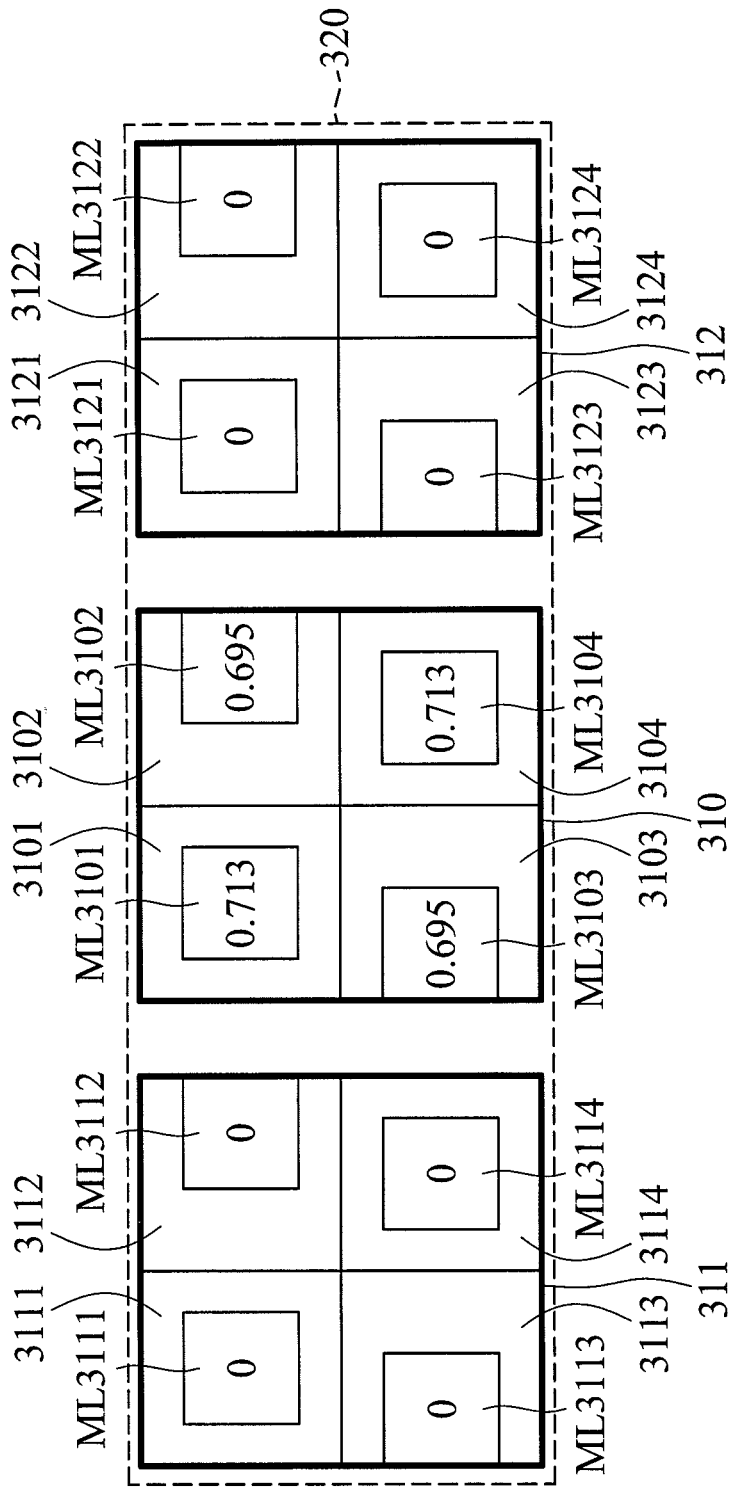
FIG. 3B is an enlarged view illustrating the macro pixels with shifted microlens in the region in accordance with the embodiment of FIG. 3A.

FIG. 3A is a cross-sectional view illustrating the structure and operation of the light-field device in accordance with an embodiment of the invention. FIG. 3B is an enlarged view illustrating the macro pixels with shifted microlens in the region in accordance with the embodiment of FIG. 3A.

Referring to FIG. 3A, it is assumed that the incident lights L2, L3, and L4 from a point object 300 exactly focuses on the image plane of the sensor array 10 via the lens 2, and the incident lights L2, L3, and L4 will be exactly emitted onto the macro pixel 310 of the sensor array 10. In addition, the macro pixels 311 and 312 neighboring to the macro pixel 310 will not receive the incident light.

Referring to FIG. 3B, the enlarged view of the region 320 of the sensor array 10 is illustrated. For example, the quantum efficiency (QE) values of the photoelectric elements 3101, 3102, 3103, and 3104 in the macro pixel 310 using the microlenses ML3101, ML3102, ML3103, and ML3104 are 0.713, 0.695, 0.695, and 0.713, respectively, and the QE values of the photoelectric elements 3111~3114 in the macro pixel 311 respectively using the microlenses ML3111~ML3114 and the QE values of the photoelectric elements 3121~3124 in the macro pixel 312 respectively using the microlenses ML3121~ML3124 are zero.

Figure 4A:
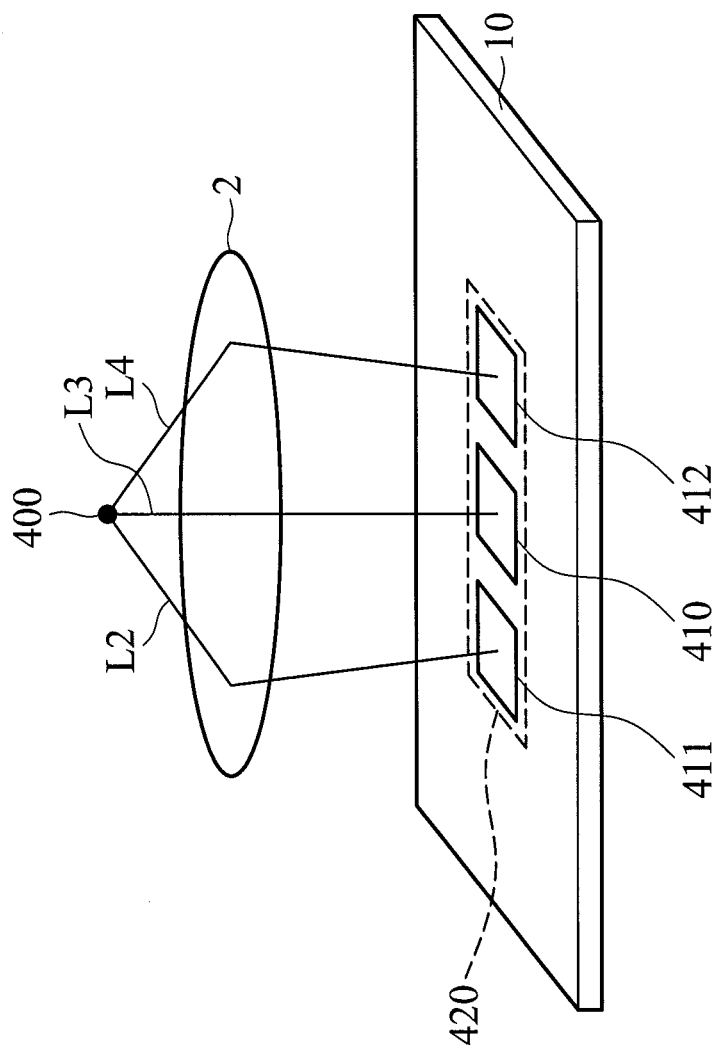
FIG. 4A is a cross-sectional view illustrating the structure and operation of the light-field device in accordance with another embodiment of the invention.
Figure 4B:
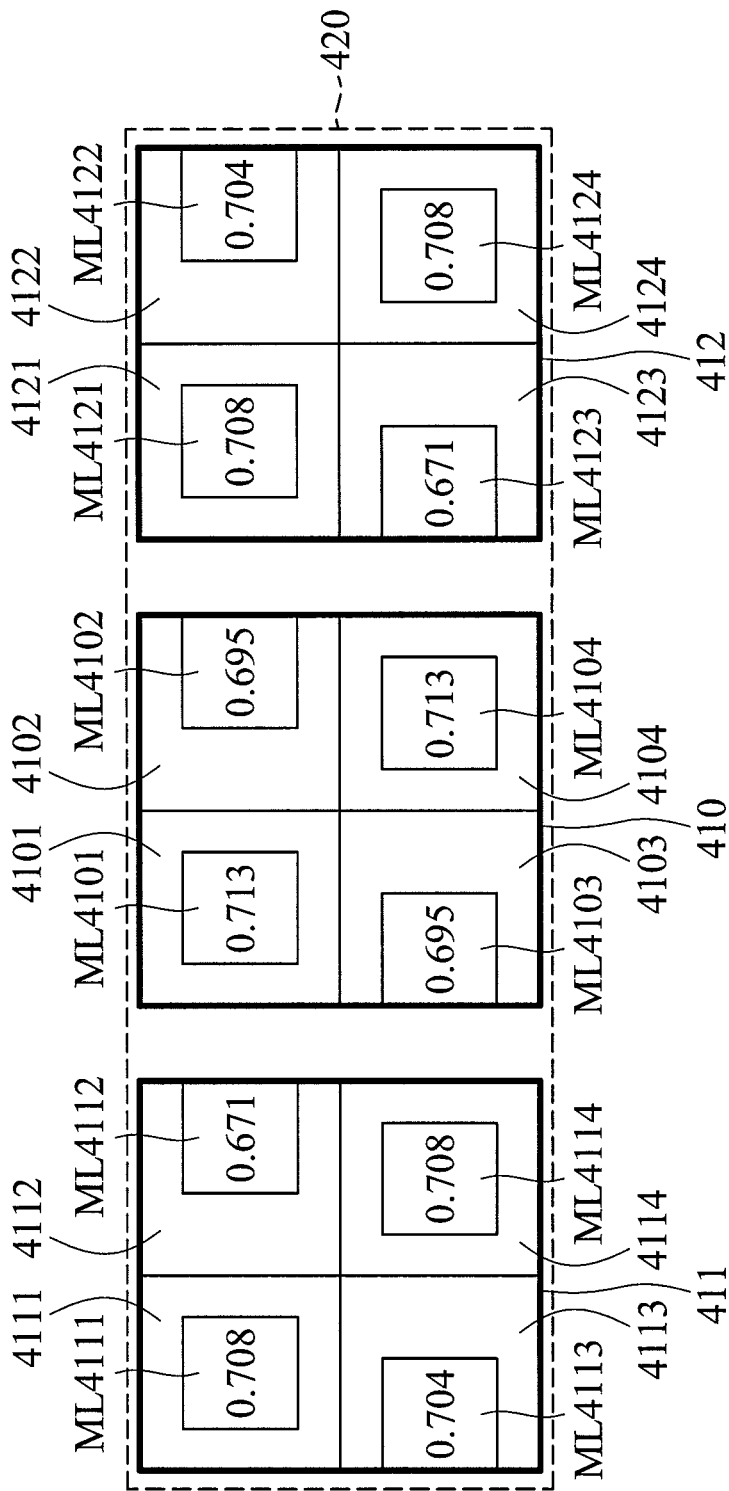
FIG. 4B is an enlarged view illustrating the macro pixels with shifted microlens in the region in accordance with the embodiment of FIG. 4A.

FIG. 4A is a cross-sectional view illustrating the structure and operation of the light-field device in accordance with another embodiment of the invention. FIG. 4B is an enlarged view illustrating the macro pixels with shifted microlens in the region in accordance with the embodiment of FIG. 4A.

Referring to FIG. 4A, in a second scenario, a point object is placed close to the light-field device 1, and thus the incident lights L2, L3, and L4 from the point object 400 focuses behind the image plane of the sensor array 10 via the lens 2. The incident lights L2, L3, and L4 will be emitted onto the macro pixels 411, 410, and 412 of the sensor array 10, respectively.

Referring to FIG. 4B, the enlarged view of the region 420 of the sensor array 10 is illustrated. For example, the QE values of the photoelectric elements 4101, 4102, 4103, and 4104 in the macro pixel 410 using the microlenses ML4101, ML4102, ML4103, and ML4104 are 0.713, 0.695, 0.695, and 0.713, respectively. In addition, the QE values of the photoelectric elements 4111, 4112, 4113, and 4114 in the macro pixel 411 using the microlenses ML4111, ML4112, ML4113, and ML4114 are 0.708, 0.671, 0.704, and 0.708, respectively. The QE values of the photoelectric elements 4121, 4122, 4123, and 4124 in the macro pixel 412 using the microlenses ML4121, ML4122, ML4123, and ML4124 are 0.708, 0.704, 0.671, and 0.708, respectively.

Figure 5A:
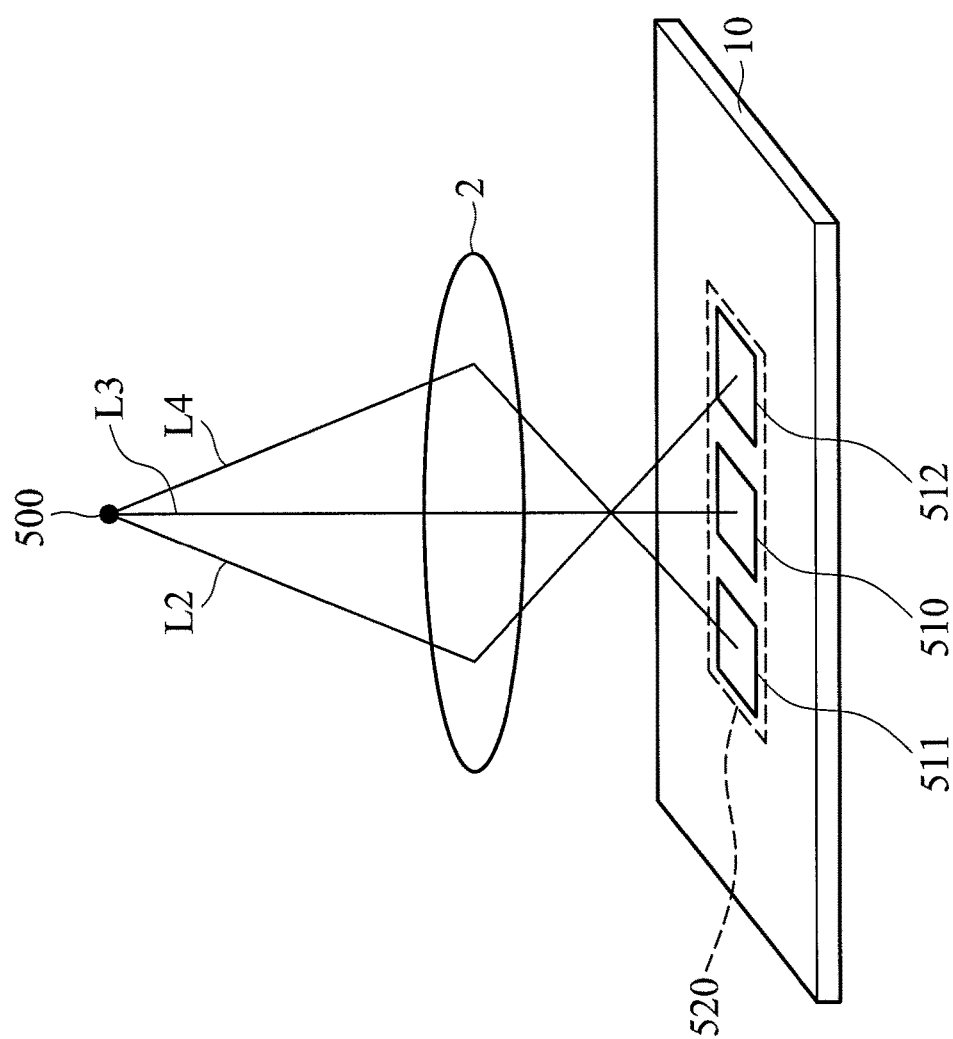
FIG. 5A is a cross-sectional view illustrating the structure and operation of the light-field device in accordance with yet another embodiment of the invention.
Figure 5B:
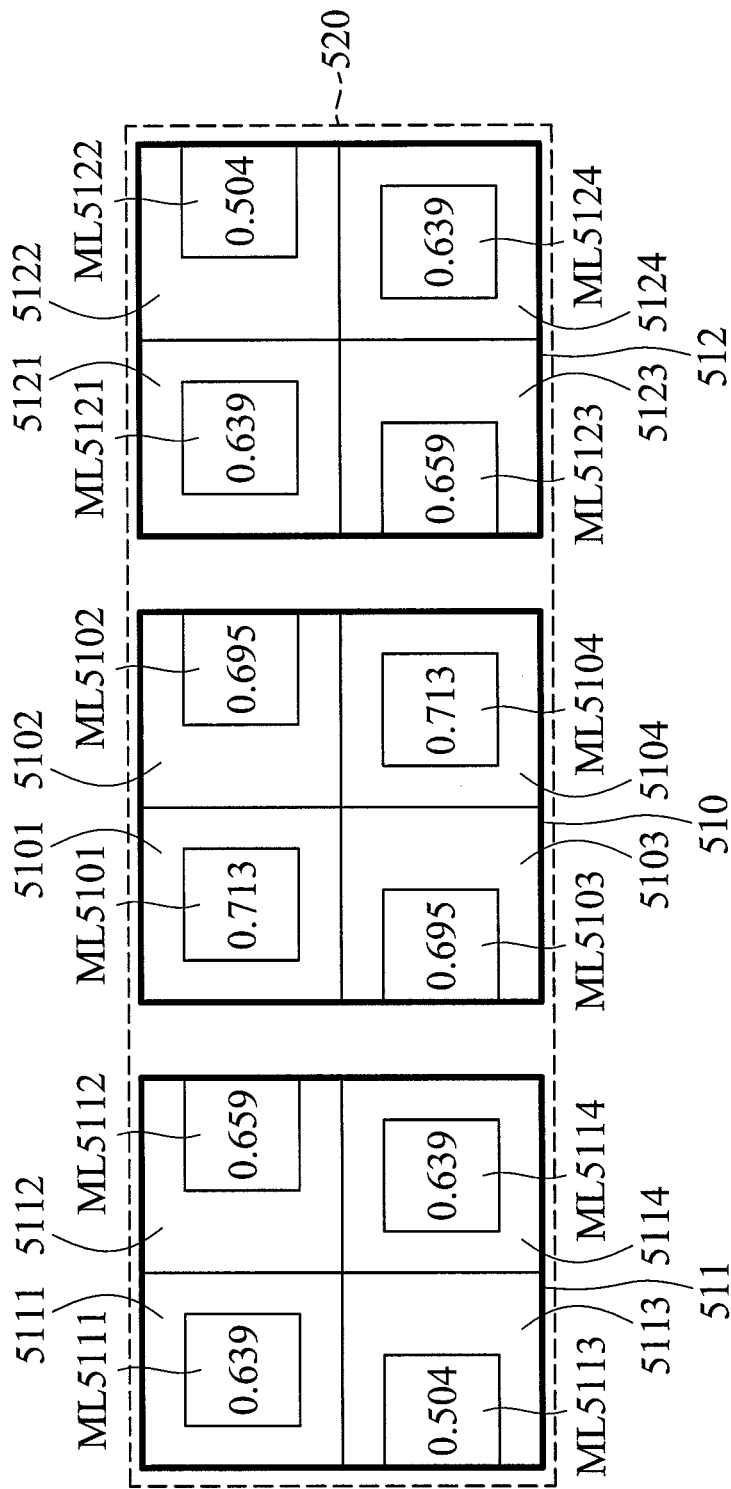
FIG. 5B is an enlarged view illustrating the macro pixels with shifted microlens in the region in accordance with the embodiment of FIG. 5A.

FIG. 5A is a cross-sectional view illustrating the structure and operation of the light-field device in accordance with yet another embodiment of the invention. FIG. 5B is an enlarged view illustrating the macro pixels with shifted microlens in the region in accordance with the embodiment of FIG. 5A.

Referring to FIG. 5A, in a third scenario, a point object 500 is placed farther from the light-field device 100, and thus the incident lights L2, L3, and L4 from the point object 500 focuses in front of the image plane of the sensor array 10 via the lens 2. The incident lights L2, L3, and L4 will be emitted onto the macro pixels 511, 510, and 512 of the sensor array 10, respectively.

Referring to FIG. 5B, the enlarged view of the region 520 of the sensor array 10 is illustrated. For example, the QE values of the photoelectric elements 5101, 5102, 5103, and 5104 in the macro pixel 510 using the microlenses ML5101, ML5102, ML5103, and ML5104 are 0.713, 0.695, 0.695, and 0.713, respectively. In addition, the QE values of the photoelectric elements 5111, 5112, 5113, and 5114 in the macro pixel 511 using the microlenses ML5111, ML5112, ML5113, and ML5114 are 0.639, 0.659, 0.504, and 0.639, respectively. The QE values of the photoelectric elements 5121, 5122, 5123, and 5124 in the macro pixel 512 using the microlenses ML5121, ML5122, ML5123, and ML5124 in the macro pixel 512 are 0.639, 0.504, 0.659, and 0.639, respectively.

In the embodiments of FIGS. 3A~3B, FIGS. 4A~4B, and FIGS. 5A~5B, the intensity signal detected by the photoelectric elements in each macro pixel has a particular intensity distribution that can be used to determine the distance and direction information of the remote object. Specifically, a look-up table recording every possible intensity distribution of the photoelectric elements in each macro pixel in the sensor array 10 can be built in advance. For example, the look-up table can be stored in a non-volatile memory (not shown) of the light-field device 100. Thus, the ISP 4 may retrieve the image signal from the image sensor 1 and determine the distance and direction information of the remote object from the look-up table according to a particular intensity distribution of the intensity signal detected by each macro pixel in the sensor array 10.

In addition, the image signal from the image sensor 1 includes images of a plurality of viewpoints captured at one time using a plurality of microlenses. The images can be analyzed by the ISP 4 so as to extract depth information. For example, since the plurality of microlenses within the microlens array have slightly different viewpoints that depend on their relative position, a plurality of images captured from each of the microlenses may have different depths. Thus, the relative distance of each object within each image may be identified by analyzing the plurality of images.

Moreover, the quantum efficiency response of the photoelectric elements using the phase microlens in the image sensor 1 is similar to that of the photoelectric elements in a conventional two-dimensional image sensor, and thus the image sensor 1 can be switched between a two-dimensional image sensor and a light-field image sensor.

In the following sections, more embodiments with different configurations of the additional offsets for one or more photoelectric elements in each macro pixel of the sensor array 10 will be described.

Figure 6:
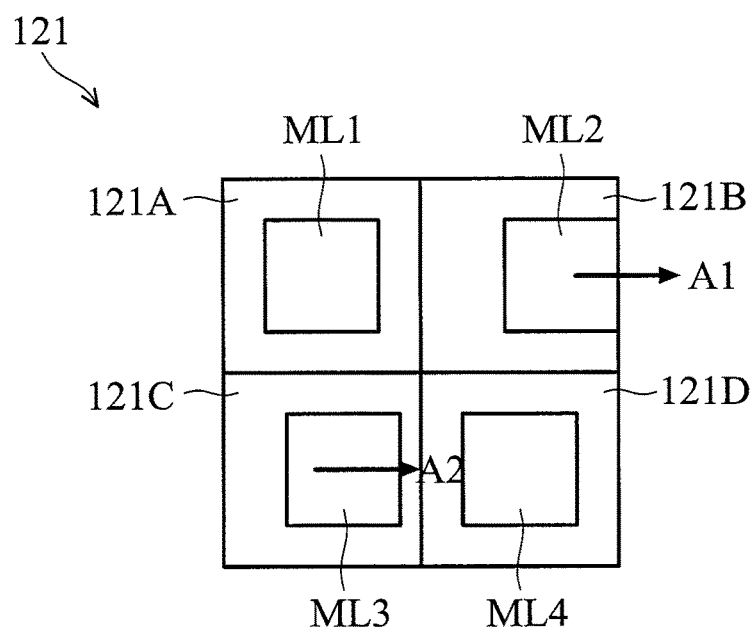
FIG. 6 is a diagram of a macro pixel with shifted microlenses in accordance with another embodiment of the invention.

FIG. 6 is a diagram of a macro pixel with shifted microlenses in accordance with another embodiment of the invention. In some embodiments, referring to FIG. 6, the microlenses ML1~ML4 in the macro pixel 121 may not be disposed directly on the photoelectric elements 121A~121D, and each of the microlenses ML1~ML4 has a respective initial offset and direction. In addition, one or more of the microlenses ML1~ML4 may also have a respective additional offset.

For purposes of description, it is assumed that the macro pixel 121 is located at the center of the sensor array 10, and the initial offsets of the microlenses ML1~ML4 are 0. The microlens ML2 associated with the photoelectric element 121B has an offset A1 in a first direction (e.g. positive direction of X-axis), and the microlens ML3 associated with the photoelectric element 121C has an offset A2 in the first direction (e.g. positive direction of X-axis). In an embodiment, the offset A1 is greater than the offset A2. That is, the microlens ML2 is shifted by a greater distance (i.e. offset A1) toward the first direction (e.g. positive direction of X-axis) than the microlens ML3 (i.e. offset A2).

Figure 7:
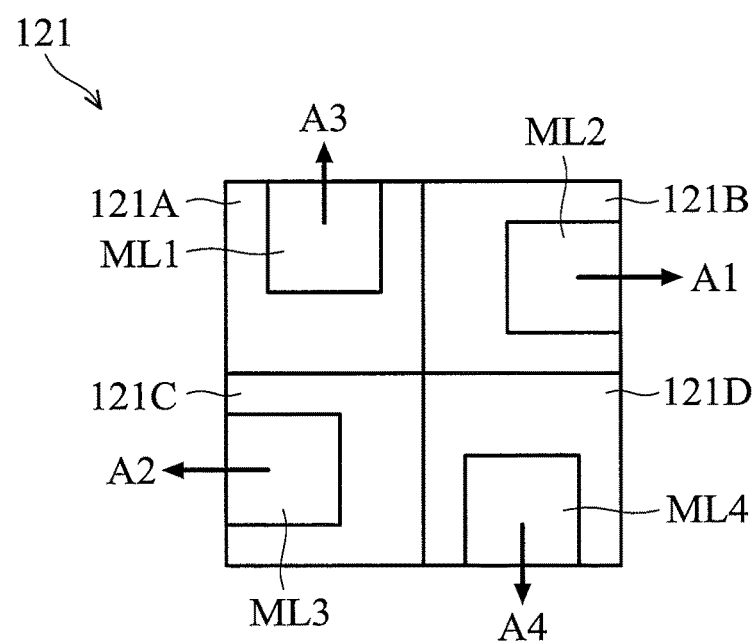
FIG. 7 is a diagram of a macro pixel with shifted microlenses in accordance with yet another embodiment of the invention.

FIG. 7 is a diagram of a macro pixel with shifted microlenses in accordance with yet another embodiment of the invention. In some embodiments, referring to FIG. 7, the microlenses ML1~ML4 in the macro pixel 121 may not be disposed directly on the photoelectric elements 121A~121D, and each of the microlenses ML1~ML4 has a respective initial offset and direction. In addition, one or more of the microlenses ML1~ML4 may also have a respective additional offset.

For purposes of description, it is assumed that the macro pixel 121 is located at the center of the sensor array 10, and the initial offsets of the microlenses ML1~ML4 are 0. The microlens ML2 associated with the photoelectric element 121B has an additional offset A1 in a first direction (e.g. positive direction of X-axis), and the microlens ML3 associated with the photoelectric element 121C has an additional offset A2 in a second direction (e.g. negative direction of X-axis) opposite to the first direction. In the embodiment, the offsets A1 and A2 are equal. That is, the microlens ML2 is shifted by an additional offset (i.e. offset A1) toward the first direction (e.g. positive direction of X-axis), and the microlens ML3 is shifted by the additional offset (i.e. offset A2) toward the second direction (e.g. negative direction of X-axis) opposite to the first direction.

In addition, the microlens ML1 associated with the photoelectric element 121A has an additional offset A3 in a third direction (e.g. positive direction of Y-axis), and the microlens ML4 associated with the photoelectric element 121D has an additional offset A4 in a fourth direction (e.g. negative direction of Y-axis) opposite to the third direction, where the third direction is perpendicular to the first direction. In the embodiment, the offsets A3 and A4 are equal. That is, the microlens ML1 is shifted by an additional offset (i.e. offset A3) toward the third direction (e.g. positive direction of Y-axis), and the microlens ML4 is shifted by the additional offset (i.e. offset A4) toward the fourth direction (e.g. negative direction of Y-axis) opposite to the third direction.

Figure 8:
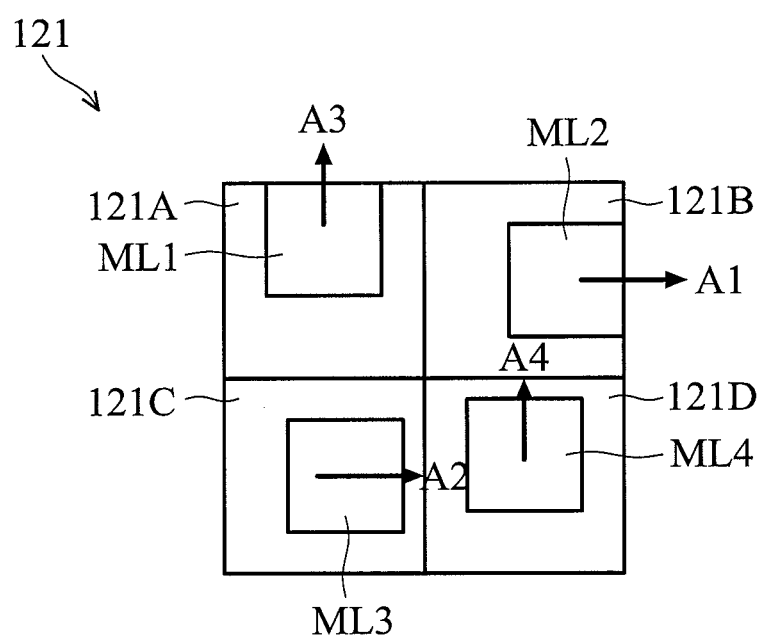
FIG. 8 is a diagram of a macro pixel with shifted microlenses in accordance with yet another embodiment of the invention.

FIG. 8 is a diagram of a macro pixel with shifted microlenses in accordance with yet another embodiment of the invention. In some embodiments, referring to FIG. 8, the microlenses ML1~ML4 in the macro pixel 121 may not be disposed directly on the photoelectric elements 121A~121D, and each of the microlenses ML1~ML4 has a respective initial offset and direction. In addition, one or more of the microlenses ML1~ML4 may also have a respective additional offset.

For purposes of description, it is assumed that the macro pixel 121 is located at the center of the sensor array 10, and the initial offsets of the microlenses ML1~ML4 are 0. The microlens ML2 associated with the photoelectric element 121B has a first additional offset A1 in a first direction (e.g. positive direction of X-axis), and the microlens ML3 associated with the photoelectric element 121C has a second additional offset A2 in the first direction (e.g. positive direction of X-axis). In the embodiment, the offsets A1 and A2 are positive values, and the offset A1 is larger than the offset A2. That is, the microlens ML2 is shifted by a greater distance (i.e. offset A1) toward the first direction (e.g. positive direction of X-axis) than the microlens ML3 (i.e. offset A2).

In addition, the microlens ML1 associated with the photoelectric element 121A has a third additional offset A3 in a second direction (e.g. positive direction of Y-axis), and the microlens ML4 associated with the photoelectric element 121D has a fourth additional offset A4 in the second direction (e.g. positive direction of Y-axis), where the second direction is perpendicular to the first direction. In the embodiment, the offsets A3 and A4 are positive values, and the offset A3 is larger than the offset A4. That is, the microlens ML1 is shifted by a greater distance (i.e. offset A3) toward the second direction (e.g. positive direction of Y-axis) than the microlens ML4 (i.e. offset A4).

It should be noted that, for purposes of description, it is assumed that the macro pixel 121 is located at the center of the sensor array 10, and the initial offsets of the microlenses ML1~ML4 are 0 in the embodiments of FIG. 2B, FIG. 6, FIG. 7, and FIG. 8. When the macro pixel is not located at the center 15 of the sensor array, the initial offsets of the microlenses ML1~ML4 are not zero. In addition, the initial offsets of the photoelectric elements within each macro pixel are different, but are very close to each other. Specifically, the overall offset of each photoelectric element in each macro pixel is calculated by adding the respective additional offset to the initial offset.

Figure 9A:
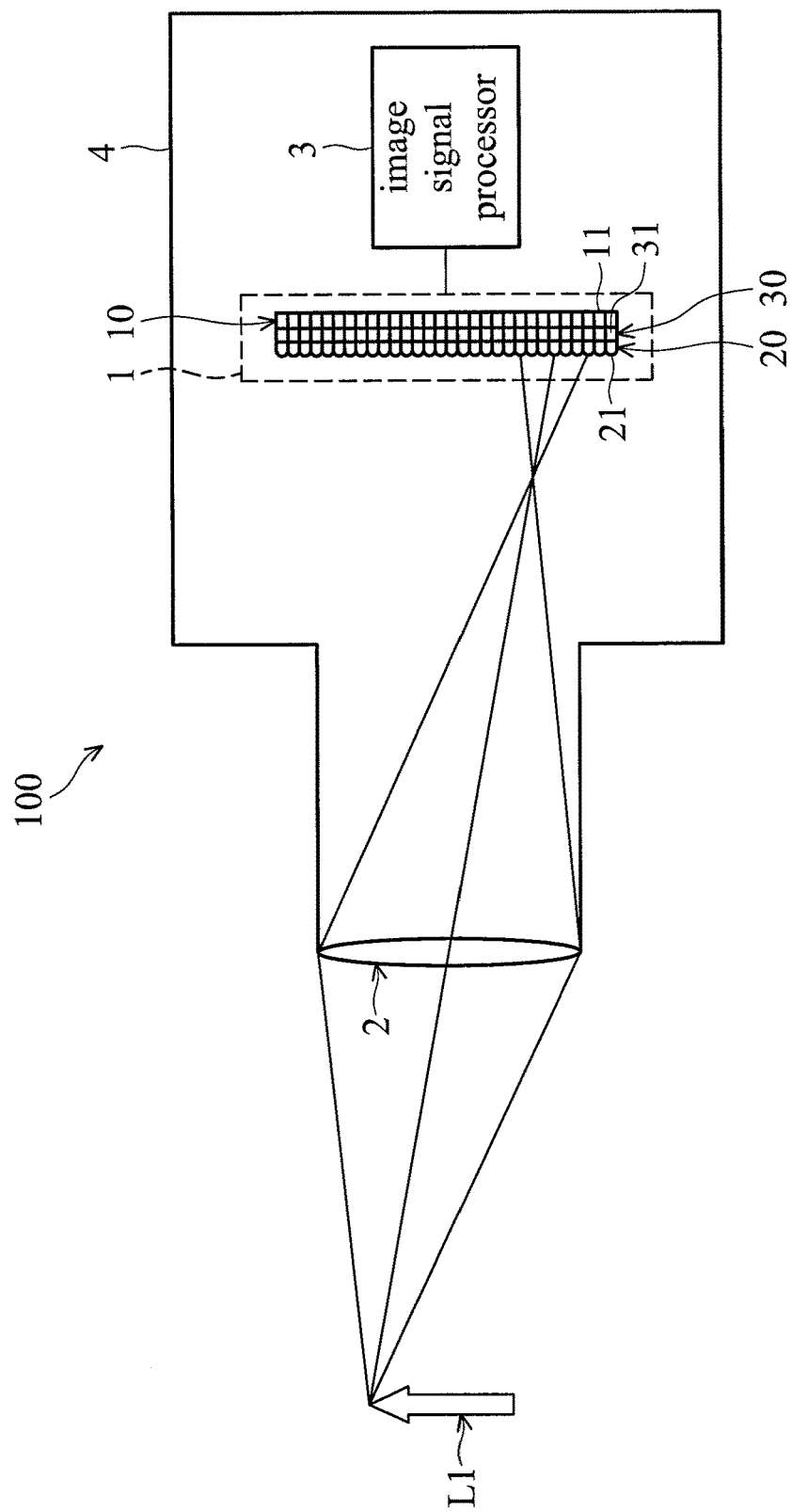
FIG. 9A is a schematic view of the light-field device 100 with a color filter array in accordance with another embodiment of the invention.

FIG. 9A is a schematic view of the light-field device 100 with a color filter array in accordance with another embodiment of the invention. In another embodiment, the image sensor 1 is a color image sensor, and a color filter may be disposed on each photoelectric element. For example, the light-field device 100 further comprises a color filter array 30 disposed between the microlens array 20 and the sensor array 10. The color filter array 30 includes a plurality of color filters 31 arranged in a two-dimensional manner.

In the embodiment, the microlenses 21 of the microlens array 20, the color filters 31 of the color filter array 30, and the photoelectric elements 11 of the sensor array 10 may be arranged in a one-to-one correspondence. Specifically, each of the color filters 31 in the color filter array 30 is disposed directly on a respective photoelectric element in the sensor array 10, and each of the microlenses in the microlens array 20 is disposed on a respective color filter in the color filter array 30. Thus, each of the color filters 31 may receive incident light via the respective microlens with or without an offset, and then extract a color component (e.g. a red, green, or blue color component) from the incident light, and the respective photoelectric element may receive the extracted color component.

Figure 9B:
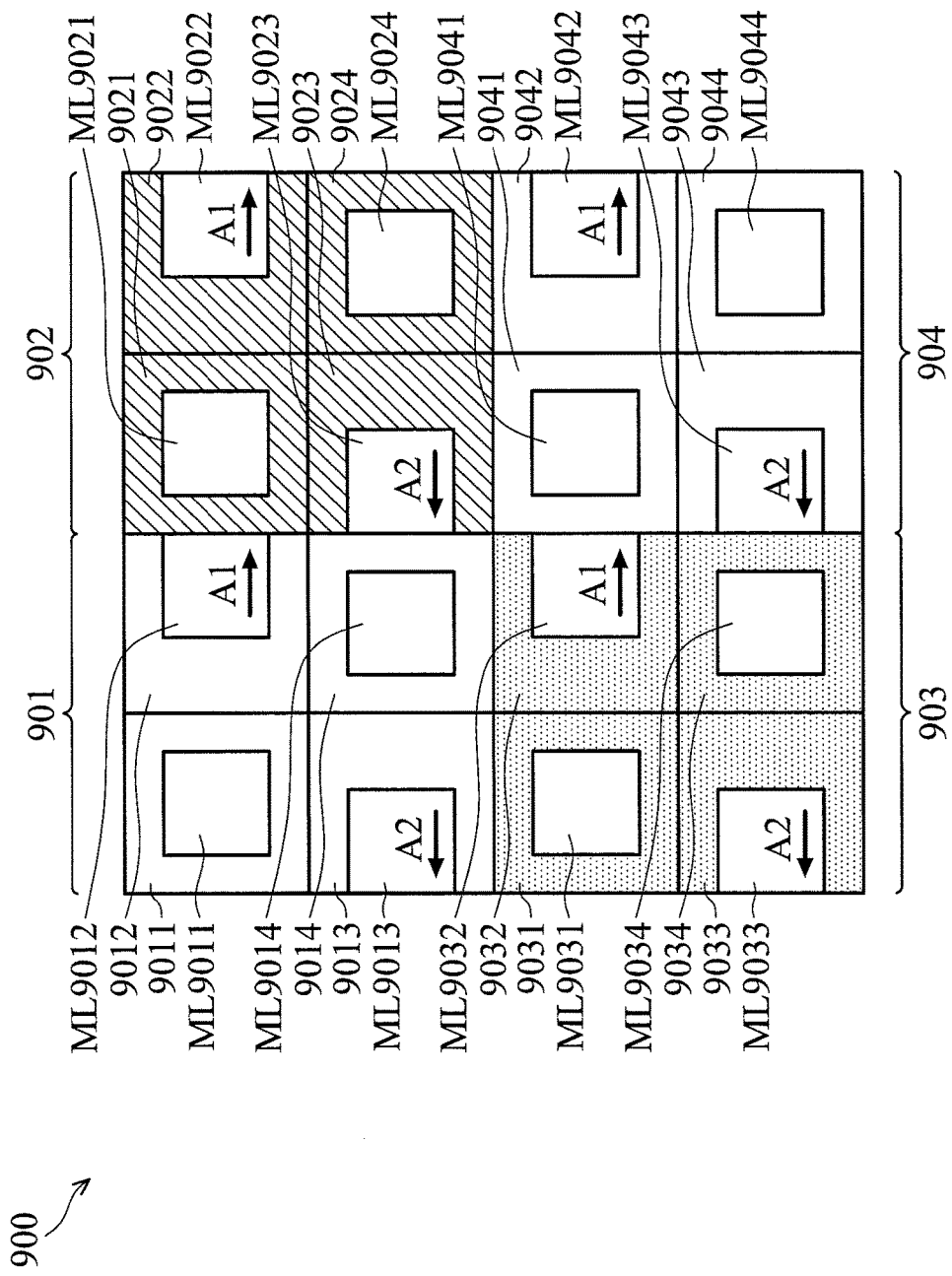
FIG. 9B is a diagram of a macro cell in accordance with an embodiment of the invention.

FIG. 9B is a diagram of a macro cell in accordance with an embodiment of the invention. In an embodiment, each of the macro pixels in the sensor array 10 corresponds to a predetermined color filter. The macro pixels in the sensor array 10 are arranged into a plurality of macro cells, and each of the macro cells includes four macro pixels arranged in a 2×2 array.

For example, the macro cell 900 includes macro pixels 901, 902, 903 and 904. The macro pixels 901, 902, 903, 904 receive green light, red light, blue light, and green light via the color filter array 30, respectively. Specifically, a green filter is disposed on each of the photoelectric elements 9011, 9012, 9013, and 9014 in the macro pixel 901. Similarly, a red filter is disposed on each of the photoelectric elements 9021, 9022, 9023, and 9024 in the macro pixel 902. A blue filter is disposed on each of the photoelectric elements 9031, 9032, 9033, and 9034 in the macro pixel 903, and a green filter is disposed on each of the photoelectric elements 9041, 9042, 9043, and 9044 in the macro pixel 904. In the embodiment, the macro pixels 901, 902, 903 and 904 forms a Bayer pattern.

Figure 9C:
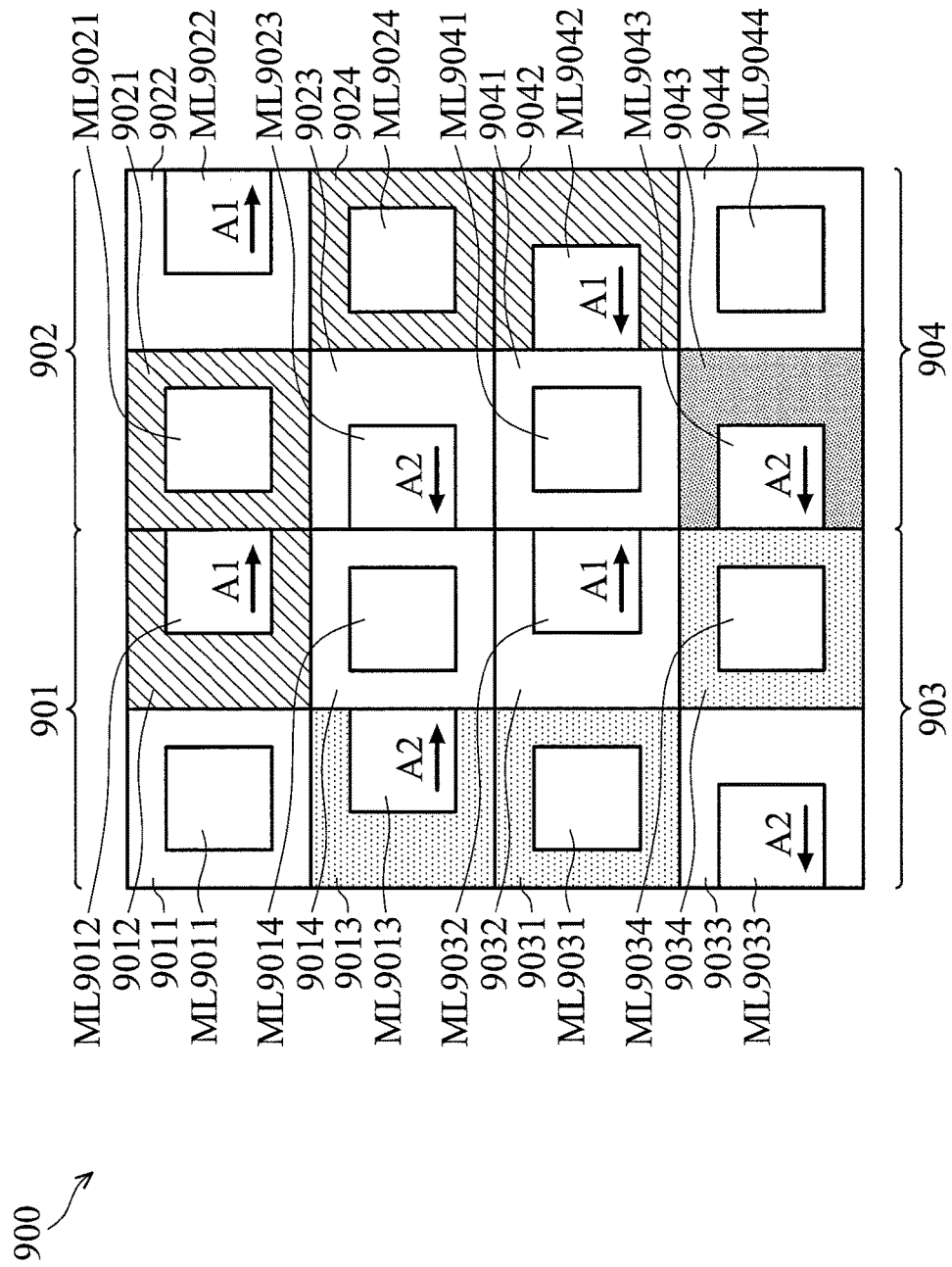
FIG. 9C illustrates an example of the macro cell 900 with random color distribution.

FIG. 9C is a diagram of a macro cell in accordance with another embodiment of the invention. In another embodiment, a random color distribution is used for each macro pixel in the macro cell 900 to suppress the Moiré effect. For example, there are 16 macro pixels in the macro cell 900. Eight, four, and four macro pixels in the macro cell 900 receive green light, red light, and blue light, respectively. The color distribution of the 16 macro pixels in the macro cell 900 may be random, but the arrangement of the macro pixels is symmetrical so as to suppress the Moiré effect.

FIG. 9C illustrates an example of the macro cell 900 with random color distribution. In addition, the additional offset for the microlens corresponding to each macro pixel is also random. For example, the additional offsets of the microlenses ML9011 and ML9014 respectively corresponding to the photoelectric elements 9011 and 9014 (i.e. green pixels) are zero. The microlens ML9012 and ML9013 respectively corresponding to the photoelectric elements 9012 (i.e. a red pixel) and 9013 (i.e. a blue pixel) has the same additional offset toward a first direction (e.g. positive direction of X-axis).

In addition, the additional offsets of the microlenses ML9021 and ML9024 respectively corresponding to the photoelectric elements 9021 and 9024 (i.e. red pixels) are zero. The microlens ML9022 corresponding to the photoelectric element 9022 (i.e. a green pixel) has a first additional offset toward the first direction (e.g. positive direction of X-axis), and the microlens ML9023 corresponding to the photoelectric element 9023 (i.e. a green pixel) has the first additional offset toward the second direction (e.g. negative direction of X-axis) opposite to the first direction.

Similarly, the additional offsets of the microlenses ML9031 and ML9034 respectively corresponding to the photoelectric elements 9031 and 9034 (i.e. blue pixels) are zero. The microlens ML9032 corresponding to the photoelectric element 9032 (i.e. a green pixel) has the first additional offset toward the first direction (e.g. positive direction of X-axis), and the microlens ML9033 corresponding to the photoelectric element 9033 (i.e. a green pixel) has the first additional offset toward the second direction (e.g. negative direction of the X-axis) opposite to the first direction.

Similarly, the additional offsets of the microlenses ML9041 and ML9044 respectively corresponding to the photoelectric elements 9041 and 9044 (i.e. green pixels) are zero. The microlens ML9042 and ML9043 respectively corresponding to the photoelectric elements 9042 (i.e. a red pixel) and 9043 (i.e. a blue pixel) has the same additional offset toward the second direction (e.g. negative direction of X-axis) opposite to the first direction.

It should be noted that, in some embodiments, the random color distribution pattern can be repeated in each macro cell in the sensor array. In some alternative embodiments, the color distribution patterns of every two neighboring macro cells are different so as to better suppress the Moiré effect.

Figure 9D:
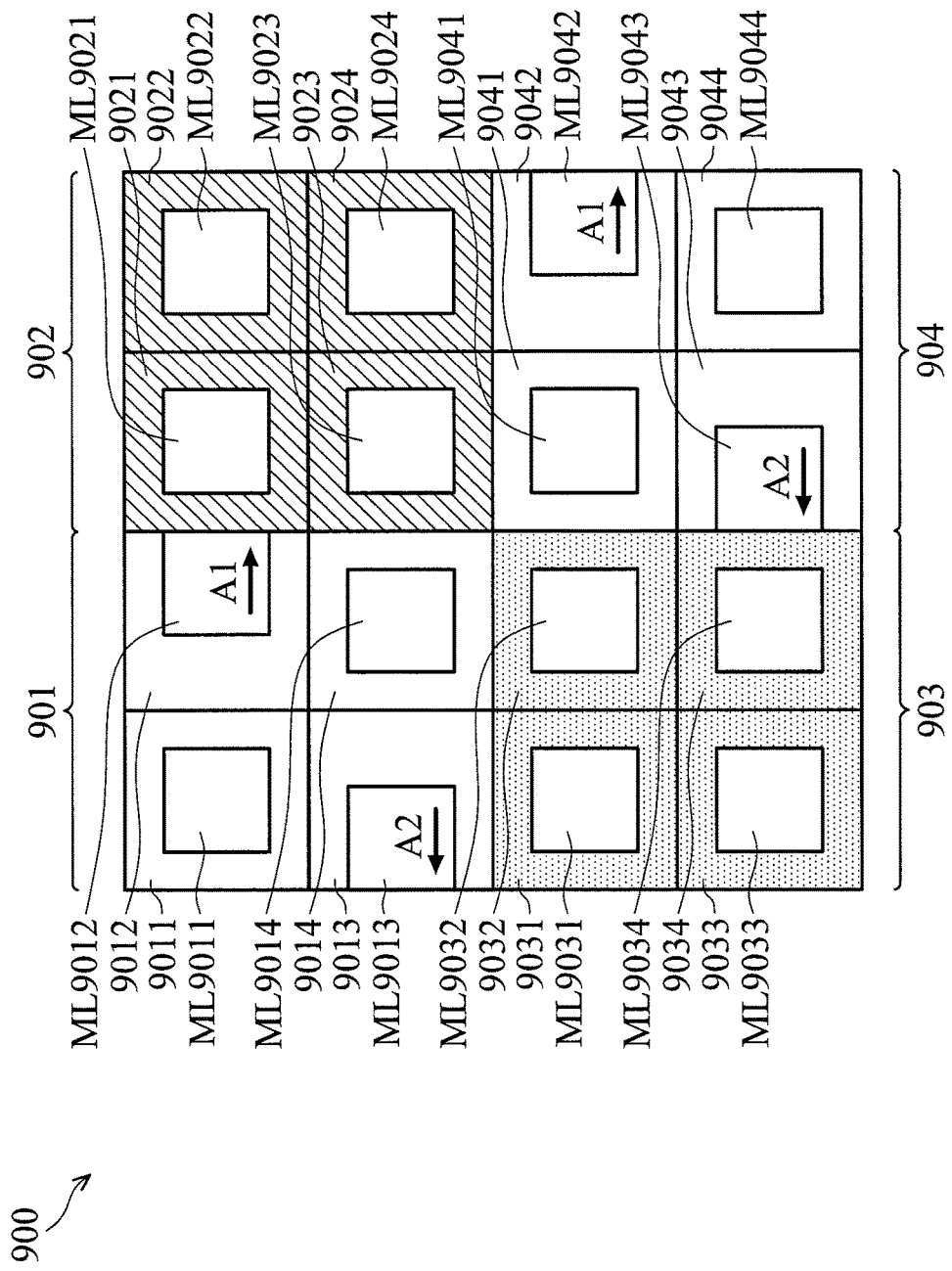
FIG. 9D is a diagram of a macro cell in accordance with yet another embodiment of the invention.

FIG. 9D is a diagram of a macro cell in accordance with yet another embodiment of the invention. In yet another embodiment, the microlenses corresponding to macro pixels in a specific color in the macro cell 900 have additional offsets, and the microlenses corresponding to macro pixels in other colors in the macro cell 900 have no addition offsets. For example, there are 16 macro pixels in the macro cell 900. Eight, four, and four macro pixels in the macro cell 900 receive green light, red light, and blue light, respectively. In the embodiment, the macro pixels 901, 902, 903 and 904 forms a Bayer pattern.

Specifically, one or more microlenses in the macro pixels 901 and 904 (i.e. receiving green light) have a respective additional non-zero offset. For example, the microlens ML9012 has an additional offset toward the first direction (e.g. positive direction of X-axis), and the microlenses ML9013 has the additional offset toward the second direction (e.g. negative direction of X-axis) opposite to the first direction. It should be noted that the microlenses ML9011 and ML9014 have no additional offsets (i.e. additional offsets of the microlenses ML9011 and ML9014 are zero).

Similarly, the microlens ML9042 has a first additional offset toward the first direction (e.g. positive direction of X-axis), and the microlenses ML9043 has a second additional offset toward the second direction (e.g. negative direction of X-axis). It should be noted that the microlenses ML9041 and ML9044 have no additional offsets (i.e. additional offsets of the microlenses ML9041 and ML9044 are zero). In an embodiment, the first additional offset and the second additional offset may be the same non-zero value. In an alternative embodiment, the first additional offset and the second offset may be different.

It should also be noted that the macro pixel 902 receives red light and the macro pixel 903 receives blue light, and the microlenses ML9021~ML9024 in the macro pixel 902 and the microlenses ML9031~ML9034 in the macro pixel 903 have no additional offsets in the present embodiment.

In the embodiment, the macro cell 900 includes a first macro pixel, a second macro pixel, and third macro pixel, and a fourth macro pixel. The upper-left 2×2 block (e.g. macro pixel 901) is the first macro pixel that receives green light. The upper-right 2×2 block (e.g. macro pixel 902) is the second macro pixel that receives red light. The bottom-left 2×2 block (e.g. macro pixel 903) is the third macro pixel that receives blue light, and the bottom-right 2×2 block (e.g. macro pixel 904) is the fourth macro pixel that receives green light.

The first and second microlenses in the second macro pixel and the third macro pixel have no additional offset. That is, the first additional offset of the first microlens and the second additional offset of the second microlens in the second macro pixel (e.g. receiving red light) and the third macro pixel (e.g. receiving blue light) are zero. Moreover, the first and second microlenses in the first macro pixel and the fourth macro pixel have a first additional offset (i.e. a non-zero value) and a second additional offset (i.e. a non-zero value), respectively. That is, the first additional offset of the first microlens and the second additional offset of the second microlens in the first macro pixel and the fourth macro pixel (i.e. both receiving green light) are non-zero.

The arrangement of macro pixels and microlenses in each of the macro cells of the sensor array 10 can be used in a phase detection auto focus (PDAF) function of the light-field device, and can be used for two-dimensional photography.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image sensor, comprising:
   a microlens array comprising a plurality of microlenses;
   a sensor array comprising a plurality of photoelectric elements that are arranged into a plurality of macro pixels;
   wherein each of the plurality of macro pixels comprises a first photoelectric element, a second photoelectric element, a third photoelectric element, and a fourth photoelectric element that receive incident light via a first microlens, a second microlens, a third microlens, and a fourth lens in the plurality of microlenses, respectively,
   wherein the first microlens, the second microlens, the third microlens, and the fourth microlens in each of the plurality of macro pixels have a first initial offset, a second initial offset, a third initial offset, and a fourth initial offset, respectively,
   wherein the first microlens and the second microlens in each of the plurality of macro pixels further have a first additional offset and a second additional offset, respectively,
   wherein each of the plurality of macro pixels in the sensor array outputs an intensity signal that is used to determine distance and direction information of an object from the incident light, and
   wherein a look-up table recording a plurality of intensity distributions of the intensity signal from each of the plurality of macro pixels in the sensor array is used to determine the distance and direction information of the object.

2. The image sensor as claimed in claim 1, wherein the first photoelectric element, the second photoelectric element, the third photoelectric element, and the fourth photoelectric element in each of the plurality of macro pixels are arranged in a first 2×2 array.

3. The image sensor as claimed in claim 1, wherein the first microlens, the second microlens, the third microlens, and the fourth microlens in each of the plurality of macro pixels are respectively shifted by the first initial offset, the second initial offset, the third initial offset, and the fourth initial offset toward a center of the sensor array.

4. The image sensor as claimed in claim 3, wherein the first microlens is further shifted by the first additional offset in a first direction, and the second microlens is further shifted by the second additional offset in the first direction, and the first addition offset is greater than the second additional offset.

5. The image sensor as claimed in claim 4, wherein the third microlens further has a third additional offset, and the fourth microlens further has a fourth additional offset, and the third microlens is further shifted by the third additional offset in a second direction, and the fourth microlens is further shifted by the fourth additional offset in the second direction,
   wherein the third additional offset is greater than the fourth additional offset, and the first direction is perpendicular to the second direction.

6. The image sensor as claimed in claim 1, wherein the plurality of microlenses is arranged in a two-dimensional manner, and there is a gap between every two neighboring microlenses in the plurality of microlenses.

7. The image sensor as claimed in claim 6, wherein the gap is filled with a low-refractive-index material.

8. The image sensor as claimed in claim 6, wherein the gap is filled with air.

9. The image sensor as claimed in claim 1, wherein a shape of the plurality of microlenses is a flat type.

10. The image sensor as claimed in claim 1, wherein the shape of the plurality of microlenses is a curve type.

11. The image sensor as claimed in claim 1, further comprising:
a color filter array, disposed between the microlens array and the sensor array, and comprising:
a plurality of green filters, for extracting green light from the incident light;
a plurality of red filters, for extracting red light from the incident light; and
a plurality of blue filters, for extracting blue light from the incident light.

12. The image sensor as claimed in claim 11, wherein the plurality of macro pixels is arranged into a plurality of macro cells, and each of the plurality of macro cells comprises a first macro pixel, a second macro pixel, a third macro pixel, and a fourth macro pixel that are arranged in a second 2×2 array.

13. The image sensor as claimed in claim 12, wherein the first macro pixel, the second macro pixel, the third macro pixel, and the fourth macro pixel in each of the plurality of macro cells receives the green light, the red light, the blue light, and the green light, respectively.

14. The image sensor as claimed in claim 12, wherein the first additional offset of the first microlens and the second additional offset of the second microlens in the second macro pixel and the third macro pixel in each of the plurality of macro cells are zero,
wherein the first additional offset of the first microlens and the second additional offset of the second microlens in the first macro pixel and the fourth macro pixel in each of the plurality of macro cells are not zero.

15. An image sensor, comprising:
a microlens array comprising a plurality of microlenses;
a sensor array comprising a plurality of photoelectric elements that are arranged into a plurality of macro pixels;
wherein each of the plurality of macro pixels comprises a first photoelectric element, a second photoelectric element, a third photoelectric element, and a fourth photoelectric element that receive incident light via a first microlens, a second microlens, a third microlens, and a fourth lens in the plurality of microlenses, respectively,
wherein the first microlens, the second microlens, the third microlens, and the fourth microlens in each of the plurality of macro pixels have a first initial offset, a second initial offset, a third initial offset, and a fourth initial offset, respectively,
wherein the first microlens and the second microlens in each of the plurality of macro pixels further have a first additional offset and a second additional offset, respectively,
wherein the first microlens, the second microlens, the third microlens, and the fourth microlens in each of the plurality of macro pixels are respectively shifted by the first initial offset, the second initial offset, the third initial offset, and the fourth initial offset toward a center of the sensor array, and
wherein the first microlens is further shifted by the first additional offset in a first direction, and the second microlens is further shifted by the second additional offset in a second direction opposite to the first direction, and the first addition offset is equal to the second additional offset.

16. The image sensor as claimed in claim 15, wherein the third microlens further has a third additional offset, and the fourth microlens further has a fourth additional offset, and the third microlens is further shifted by the third additional offset in a third direction, and the fourth microlens is further shifted by the fourth additional offset in a fourth direction opposite to the third direction,
wherein the third additional offset is equal to the fourth additional offset, and the first direction is perpendicular to the third direction.

\* \* \* \* \*